(12) United States Patent
Secareanu

(10) Patent No.: US 10,615,252 B2
(45) Date of Patent: Apr. 7, 2020

(54) DEVICE ISOLATION

(71) Applicant: NXP USA, Inc., Austin, TX (US)

(72) Inventor: Radu Mircea Secareanu, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/055,451

(22) Filed: Aug. 6, 2018

(65) Prior Publication Data
US 2020/0044021 A1  Feb. 6, 2020

(51) Int. Cl.
*H01L 29/06* (2006.01)
*H01L 21/762* (2006.01)

(52) U.S. Cl.
CPC ...... *H01L 29/0646* (2013.01); *H01L 29/0649* (2013.01); *H01L 21/76267* (2013.01); *H01L 21/76283* (2013.01)

(58) Field of Classification Search
CPC ............. H01L 29/0646; H01L 29/0649; H01L 21/76283; H01L 21/76267
See application file for complete search history.

(56) References Cited

U.S. PATENT DOCUMENTS

| 7,432,551 | B2 | 10/2008 | Yamamoto et al. | |
|---|---|---|---|---|
| 7,608,913 | B2 | 10/2009 | Secareanu | |
| 9,136,327 | B1 * | 9/2015 | Cheng | H01L 29/0649 |
| 9,362,160 | B2 | 6/2016 | Hurwitz et al. | |
| 2001/0010402 | A1 * | 8/2001 | Matsuki | H01L 21/32053 257/754 |
| 2001/0023962 | A1 * | 9/2001 | Pasqualini | H01L 27/0255 257/355 |
| 2006/0124982 | A1 * | 6/2006 | Ho | H01L 27/0805 257/304 |
| 2006/0231891 | A1 * | 10/2006 | Wang | H01L 21/743 257/347 |
| 2013/0181322 | A1 | 7/2013 | Hurwitz et al. | |
| 2015/0255537 | A1 * | 9/2015 | Pigott | H01L 29/0649 257/506 |
| 2015/0270333 | A1 * | 9/2015 | Yang | H01L 29/063 257/337 |
| 2015/0340448 | A1 * | 11/2015 | Babcock | H01L 27/0623 257/340 |
| 2016/0013205 | A1 * | 1/2016 | Vinet | H01L 21/762 257/351 |
| 2016/0013206 | A1 * | 1/2016 | Vinet | H01L 21/76237 257/351 |
| 2016/0056234 | A1 * | 2/2016 | Cheng | H01L 29/0649 327/535 |
| 2016/0064416 | A1 * | 3/2016 | Makiyama | H01L 21/84 257/350 |
| 2016/0163583 | A1 * | 6/2016 | Liu | H01L 21/76229 257/401 |

(Continued)

*Primary Examiner* — Sitaramarao S Yechuri
(74) *Attorney, Agent, or Firm* — Rajeev Madnawat

(57) ABSTRACT

A device fabricated on a wafer is disclosed. The device includes a first block of the wafer and a second block of the wafer isolated from the first block using a first deep trench isolation (DTI). The device further includes a third block of the wafer isolated from the second block using a second DTI. The second block includes a first vertical section coupled to a first ground, a second vertical section, a third vertical section coupled to a second ground. The second vertical section is doped lightly compared to the first vertical section and the second vertical section.

14 Claims, 4 Drawing Sheets

(56) References Cited

U.S. PATENT DOCUMENTS

| | | | |
|---|---|---|---|
| 2016/0172245 A1* | 6/2016 | Babcock | H01L 27/0623 |
| | | | 438/234 |
| 2016/0233294 A1* | 8/2016 | Babcock | H01L 21/26513 |
| 2017/0294379 A1* | 10/2017 | Dutartre | H01L 29/0649 |
| 2019/0103339 A1* | 4/2019 | Goktepeli | H01L 21/76898 |
| 2019/0280121 A1* | 9/2019 | Hee | H01L 29/788 |

* cited by examiner

DEVICE ISOLATION

BACKGROUND

In the past, discrete components were used to be assembled on a circuit board to build a system. Components were used to spaced out on the circuit board and the spacing was mostly sufficient to diminish noise interference from some components that could affect the operations of the other components. However, in the age of circuit miniaturization and market's demand for a complete system in one single integrated circuit force system designers to fabricate noise producing components and the components that may be affected by the noise side by side, often nanometers away from each other, on a same wafer.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a device fabricated on a wafer is disclosed. The device includes a first block of the wafer and a second block of the wafer isolated from the first block using a first deep trench isolation (DTI). The device further includes a third block of the wafer isolated from the second block using a second DTI. The second block includes a first vertical section coupled to a first ground, a second vertical section, a third vertical section coupled to a second ground. The second vertical section is doped lightly compared to the first vertical section and the second vertical section. The first vertical section and the second vertical section are either P+ or N+ doped to provide a low resistance path to noise from the first block.

In another embodiment, a device fabricated on a wafer is disclosed. The device includes a first block of the wafer, a second block of the wafer isolated from the first block using a first deep trench isolation (DTI) and a third block of the wafer isolated from the second block using a second DTI. The second block is highly doped to provide a lower resistance than wafer resistance of the first block and the third block, wherein the second block is coupled to a ground. The second block is either P+ or N+ doped to provide a low resistance path to noise from the first block In yet another embodiment, a device fabricated on a wafer is disclosed. The device includes a first block of the wafer, a second block of the wafer isolated from the first block using a first deep trench isolation (DTI) and a third block of the wafer isolated from the second block using a second DTI. The second block is doped to provide a higher resistance than wafer resistance of the first block and the third block.

In some examples, the wafer includes a horizontal buried oxide layer under the first block, the second block and the third block.

The ground(s) is isolated such that no components of the first block and the third block are not coupled to the same ground on the wafer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

To provide noise isolation between a noise producing block and a noise sensitive block, a low-impedance path for noise is placed between the noise producing block and the noise sensitive block, so that the noise from the noise producing block does not reach the noise sensitive block. In some embodiments, the noise is sunk into an external ground coupled to a noise blocking block placed between the noise producing block and the noise sensitive block.

In some examples, a high impedance block is placed in-between the noise producing block and the noise sensitive block so that the noise reaching the noise sensitive block is reduced. In some other example, a sequence of low-impedance noise sinks and high impedance path are placed between the noise producing block and the noise sensitive block, to reduce the noise reaching the noise sensitive block and also sink part of the noise out into an external ground.

Figure 1:
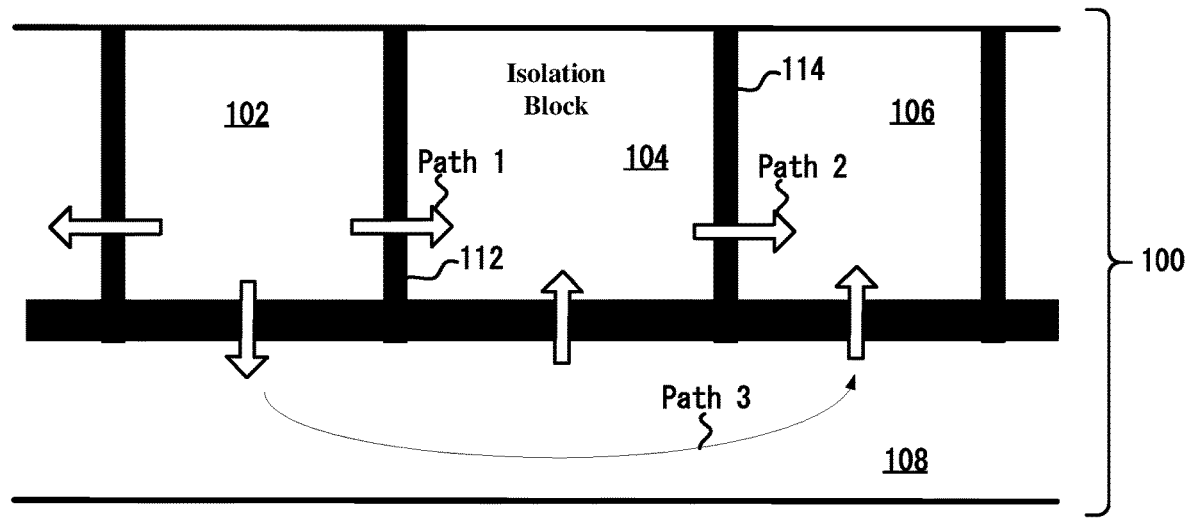
FIG. 1 depicts a schematic diagram of a wafer including a noise producing block, an isolation block and a noise sensitive block in accordance with one or more embodiments of the present disclosure.

FIG. 1 shows a wafer 100 having a noise producing block 102 (shown as Block 1), an isolation block 104 and a noise sensitive block 106 (shown as Block 2). It should be noted that the noise producing block 102 includes components (not shown) that produce noise and similarly the noise sensitive block 106 includes components (not shown) that may be affected by the noise produced by the components of the noise producing block 102. The noise producing block 102 and the noise sensitive block 106 may be separated from other portions of the wafer 100 using deep trench isolation (DTI) 112, 114 to prevent electric current leakage from devices or components from the enclosed block. In some examples, DTI 112, 114 can be created by etching, thermal oxidation for inner oxide layer and filing the remaining etched trench with chemical vapor deposition oxide.

The wafer 100 may also include a horizontal buried oxide layer 110 to lower parasitic capacitance. The embodiments described herein uses Silicon on insulator (SOI) technology. SOI refers to the use of a layered silicon-insulator-silicon substrate in place of conventional silicon substrates to reduce parasitic device capacitance, thereby improving performance. SOI-based devices differ from conventional silicon-built devices in that the silicon junction is above an electrical insulator, typically silicon dioxide. It should be noted that the embodiments described herein may also be used in fabrication technologies other than SOI.

Also shown are possible noise paths, Path 1, Path 2 and Path 3 through which noise from the noise producing block 102 may travel to the noise sensitive block 106. Embodiments described here reduces the noise that can travel via these paths.

The isolation block 104 may be a p-type well with low doping. Typically, a normal p-type well is formed with a doping level approximately 1e18. However, the doping of the isolation area 104 p-type well may typically be in the range of 1e15 to 5e15 (with a lower value more typical). Low doping causes high impedance within the isolation block 104.

Figure 2:
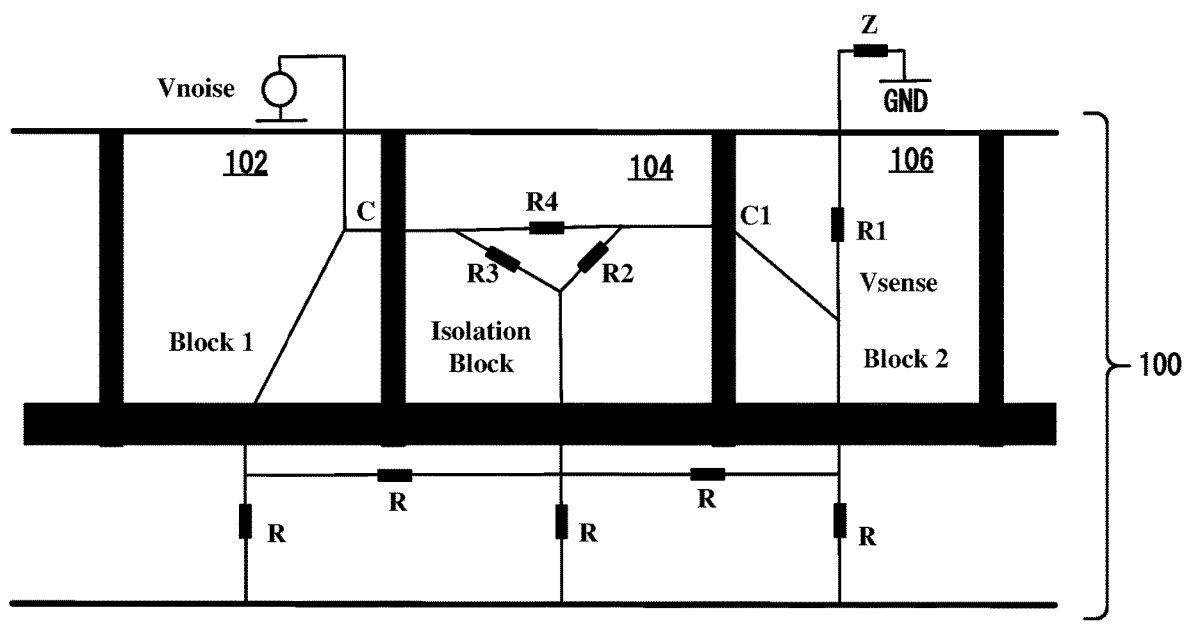
FIG. 2 depicts a parasitic electric diagram corresponding to blocks in FIG. 1 in accordance with one or more embodiments of the present disclosure.

FIG. 2 illustrates a network of parasitic resistance (R) and capacitance (C) formed within the noise producing block 102, DTI 112, 114, the buried oxide layer 110, the isolation block 104 and the noise sensitive block 106, in noise paths Path 1, Path 2 and Path 3. Also shown is hypothetical Vnoise generator and Vsense connected to the parasitic network of resistors and capacitors. As apparent, Vnoise meets with high resistance network in potential noise paths causing a low value of Vsense in the noise sensitive block 106. The impedances R2, R3, R4 need to be as large as possible, in particular as compared to the reactance of C1, and impedance R1 plus Z, to create a voltage divider for the noise seen at the noise sensitive block 106. Further, for a better efficiency, C2 should be as small as possible.

Figure 3:
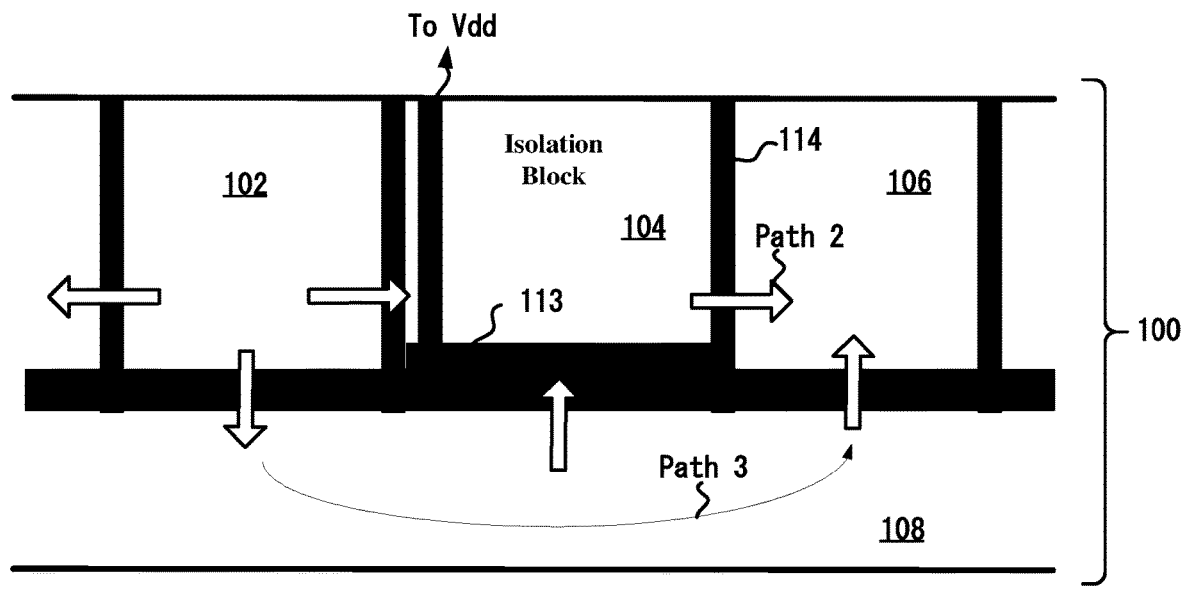
FIG. 3 depicts a schematic diagram of a wafer of FIG. 1 in another embodiment.

FIG. 3 shows the wafer 100 depicted in FIG. 1 in another embodiment. In order to have a smaller C2 to provide a less restrictive path to noise away from the noise sensitive block 106. To fabricate the isolation block 104 with smaller C2, an n-well 113 is fabricated over the buried oxide layer 110 inside the isolation block 104. The n-well 113 extends to the surface of the wafer 100 and is configured to be connected to supply terminal (Vdd). The n-well 113 biased with Vdd creates another parasitic capacitor which causes the overall value of C2 to be lower than the value without the n-well 113.

Figure 4:
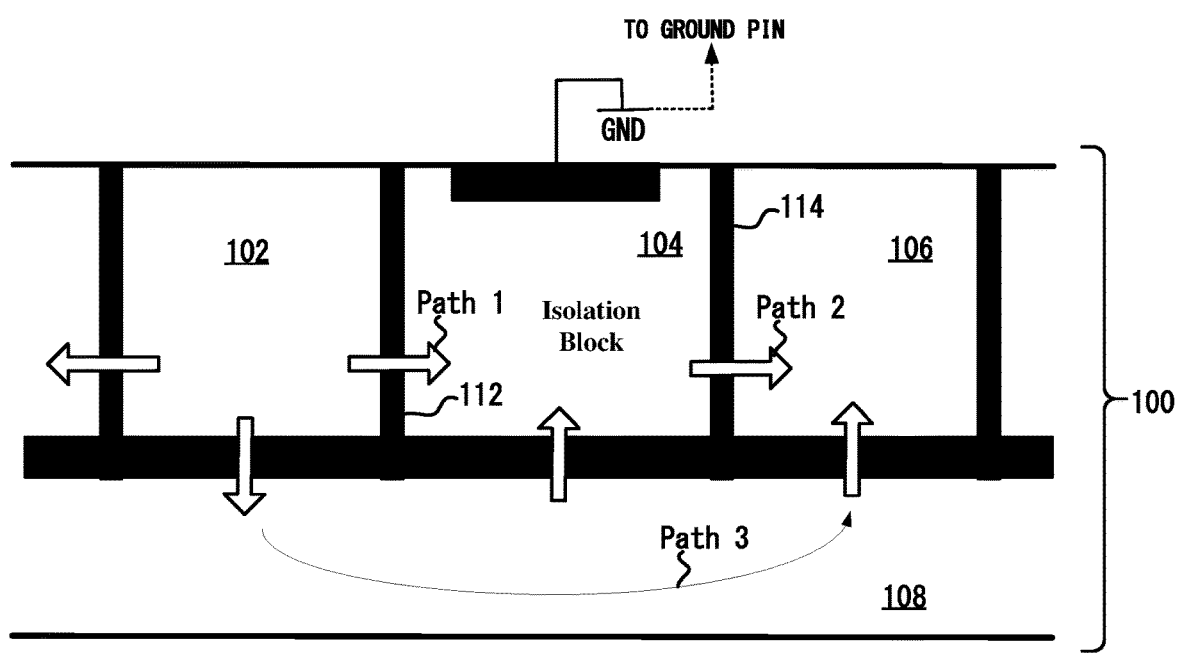
FIG. 4 depicts a schematic diagram of a wafer including a noise producing block, an isolation block coupled to ground and a noise sensitive block in accordance with one or more embodiments of the present disclosure.
Figure 5:
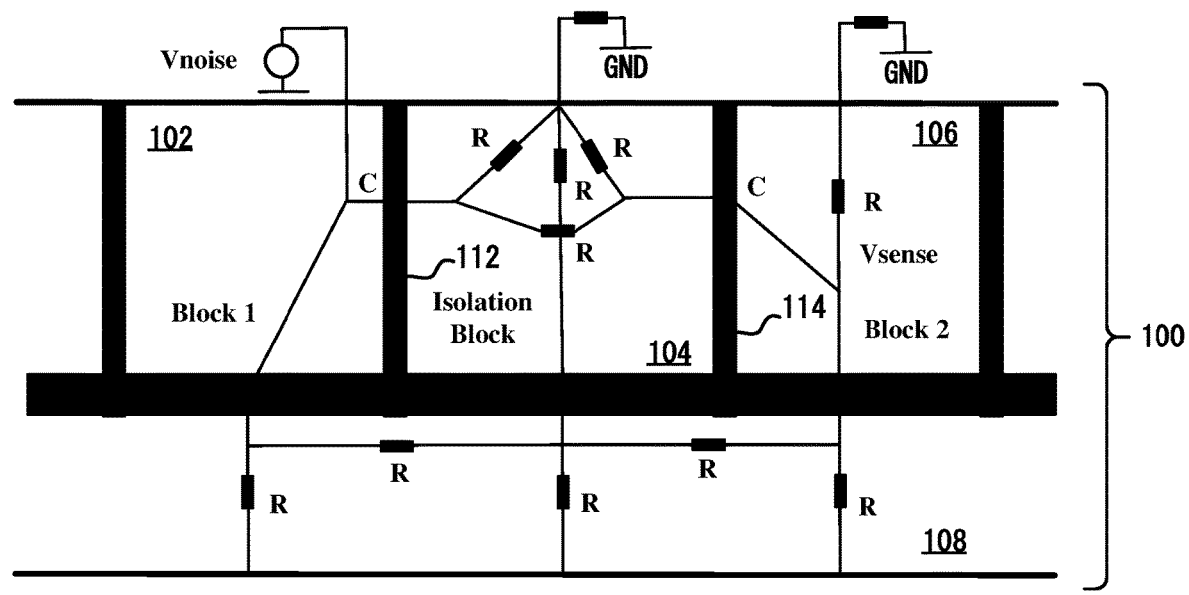
FIG. 5 depicts a parasitic electric diagram corresponding to blocks in FIG. 3 in accordance with one or more embodiments of the present disclosure.

FIGS. 4 and 5 show the wafer 100 in another embodiment. In this embodiment, the isolation block 104 includes a P+ well covering substantially the entire area of the isolation block 104. The isolation block 104 is connected to ground. The noise producing block 102 injects noise capacitively (through DTI 112 and the buried oxide layer 110 capacitance respectively), while the noise sensitive block 106 receives noise also capacitively, similarly, through DTI 114 capacitance and the buried oxide layer capacitance. Accordingly, the noise from the noise producing block 102 to the noise sensitive block 106 is transmitted through Path 1 and Path 2, Path 3. The isolation block 104, inserted between the noise producing block 102 and the noise sensitive block 106, will divert the noise from reaching the noise sensitive block 106 naturally, using the native parasitic capacitance as shown in FIG. 5. This noise is channeled into ground connection through the P+ well. In a preferred embodiment, GND is a dedicated ground that is not used for any other part of the circuit in the noise producing block 102 or the noise sensitive block 106 otherwise noise being sunk to GND may find a path to other circuits via ground coupling. To accomplish ground isolation, GND is connected directly to the ground pin of the integrated circuit that includes the wafer 100. Ground connections from other components on the wafer 100 do not meet the connection from GND to the ground pin. As apparent, the use of P+ well covering substantially all area of the isolation block 104 provides a low impedance for the noise so that the noise finds a sink to ground through the isolation block 104.

Figure 6:
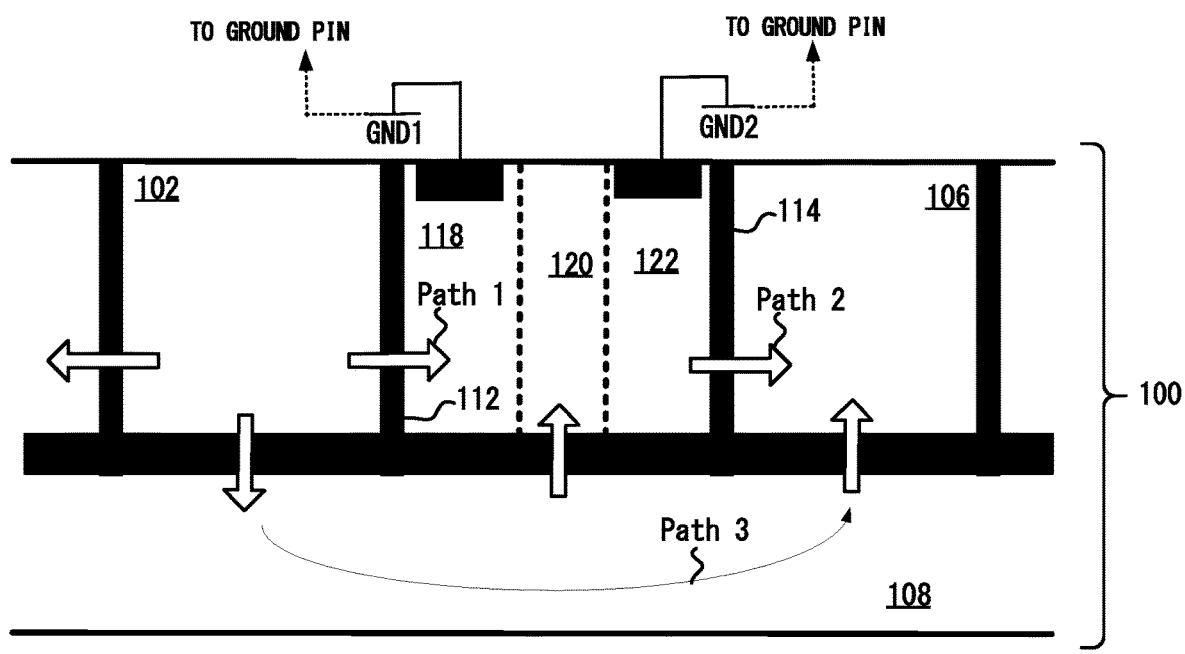
FIG. 6 depicts a schematic diagram of a wafer including a noise producing block, an isolation block coupled to two separate grounds and a noise sensitive block in accordance with one or more embodiments of the present disclosure.

FIG. 6 shows the wafer 100 in another embodiment. In this example, the isolation block 104 includes the features of the embodiment in FIG. 1 and the embodiment in FIG. 4. Accordingly, the isolation block 104 includes a first P+ wells 118 on the side of the noise producing block 102 and a second P+ well 122 next on the side of the noise sensitive block 106. In between the first P+ well 118 and the second P+ well 122, there is a low doped well 120. The first P+ well 118 is connected to a first ground GND1 and the second P+ well 122 is connected to a second ground GND2. GND1 and GND2 are not coupled to each other or to another ground in the circuit in the noise producing block 102 and the noise sensitive block 106. In some examples, N+ doping may be used instead of P+ doping.

Figure 7:
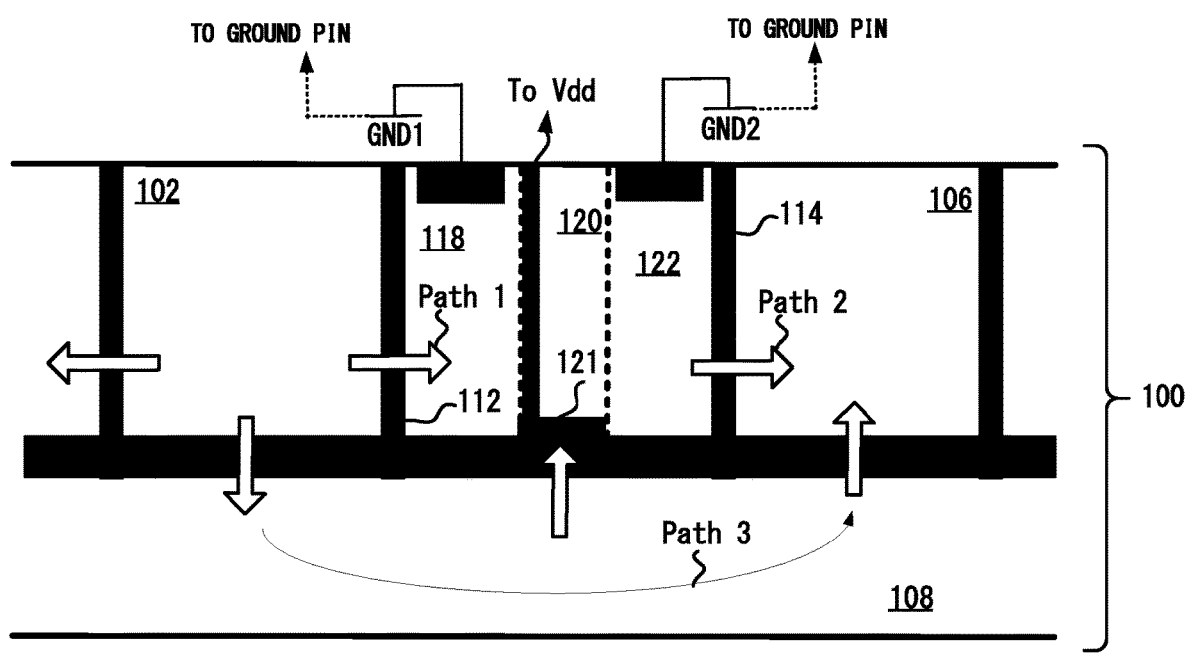
FIG. 7 depicts a schematic diagram of a wafer of FIG. 6 in another embodiment.

FIG. 7 shows the water 100 depicted in FIG. 6 in another embodiment. Similar to the embodiment of FIG. 3, an n-well 121 is added over the buried oxide layer 110 inside the block 120 to reduce overall parasitic capacitance caused by the buried oxide layer 110.

With respect to FIGS. 6 and 7, the vertical sections 118, 122 needs to be made wider depending on design considerations for specific applications. The wider the vertical sections 118, 122 are the lower the parasitic capacitance. For example, if the device being fabricated in the wafer 100 is to be used for high frequency applications, the vertical sections 118, 122 needs to be wider compared to if the device is to be used for lower frequency applications. Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A device fabricated on a wafer, the device comprising:
   a first block of the wafer;
   a second block of the wafer isolated from the first block using a first deep trench isolation (DTI); and
   a third block of the wafer isolated from the second block using a second DTI, wherein the second block is highly doped to provide a lower resistance than wafer resistance of the first block and the third block, the second block is coupled to a dedicated ground that is not used for the first block or the third block.

2. The device of claim 1, wherein the wafer includes:
   a horizontal buried oxide layer under the first block, the second block, and the third block.

3. The device of claim 1 wherein the second block is P+ doped to provide a low resistance path to noise from the first block.

4. The device of claim 1, wherein the second block is N+ doped to provide a low resistance path to noise from the first block.

5. The device of claim 1, wherein the dedicated ground is connected directly to a ground pin of an integrated circuit that includes the wafer.

6. A device fabricated on a wafer, the device comprising:
   a first block of the wafer;
   a second block of the wafer isolated from the first block using a first deep trench isolation (DTI); and
   a third block of the wafer isolated from the second block using a second DTI, wherein the second block includes a first vertical section coupled to a first ground, a second vertical section, a third vertical section coupled to a second ground, wherein the second vertical section is doped lightly compared to the first vertical section and the third vertical section, wherein the wafer includes a horizontal buried oxide layer under the first block, the second block, and the third block.

7. The device of claim 6, wherein the first ground is isolated such that no components of the first block and the third block are not coupled to the same first ground on the wafer.

8. The device of claim 6, wherein the second ground is isolated such that no components of the first block and the third block are coupled to the same second ground on the wafer.

9. The device of claim 6, wherein the first vertical section and the second vertical section are P+ doped to provide a low resistance path to noise from the first block.

10. The device of claim 6, wherein the first vertical section and the second vertical section are N+ doped to provide a low resistance path to noise from the first block.

11. The device of claim 6, wherein the second vertical section includes:
    an n-well layer over the horizontal buried oxide layer, wherein the n-well is configured to be connected to a supply voltage.

12. A device fabricated on a wafer, the device comprising:
    a first block of the wafer;
    a second block of the wafer isolated from the first block using a first deep trench isolation (DTI); and
    a third block of the wafer isolated from the second block using a second DTI, wherein the second block is doped to provide a higher resistance than wafer resistance of the first block and the third block, wherein the wafer includes a horizontal buried oxide layer under the first block, the second block, and the third block.

13. The device of claim 12, wherein the second block is doped in a range from 1e15 to 5e15.

14. The device of claim 12, wherein the second block includes:
    an n-well layer over the horizontal buried oxide layer, wherein the n-well is configured to be connected to a supply voltage.

* * * * *